(12) United States Patent
Koshelev et al.

(10) Patent No.: US 6,818,912 B2
(45) Date of Patent: *Nov. 16, 2004

(54) RADIATION SOURCE, LITHOGRAPHIC APPARATUS, DEVICE MANUFACTURING METHOD, AND DEVICE MANUFACTURED THEREBY

(75) Inventors: Konstantin Nikolaevitch Koshelev, Troitsk (RU); Frederik Bijkerk, Amsterdam (NL); Givi Georgievitch Zukavishvili, Troitsk (RU); Evgenii Dmitreevitch Korop, Troitsk (RU); Vladimir Vital'evitch Ivanov, Moscow (RU)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/700,445

(22) Filed: Nov. 5, 2003

(65) Prior Publication Data

US 2004/0089819 A1 May 13, 2004

Related U.S. Application Data

(63) Continuation of application No. 09/893,347, filed on Jun. 28, 2001, now Pat. No. 6,667,484.

(30) Foreign Application Priority Data

Jul. 3, 2000 (EP) ............................................ 00202304

(51) Int. Cl.[7] .............................................. G03B 42/00
(52) U.S. Cl. ................................ 250/504 R; 250/492.2
(58) Field of Search ........................... 250/504 R, 492.2

(56) References Cited

U.S. PATENT DOCUMENTS 4,494,043 A    1/1985   Stallings et al.
4,644,576 A    2/1987   Kuyel
6,414,438 B1   7/2002   Borisov et al.
6,667,484 B2 * 12/2003  Koshelev et al. ........ 250/492.2

FOREIGN PATENT DOCUMENTS

EP         0 480 617 A2    10/1991

OTHER PUBLICATIONS

Patent Abstracts of Japan, Publication No. 62176038, Aug. 1, 1987.

Bergmann, K., et al., "Highly Repetitive, Extreme–Ultraviolet Radiation Source Based on a Gas–Discharge Plasma," *Applied Optics*, vol. 38, No. 25, Sep. 1, 1999, pp. 5413–5417.

Va'vra, J., et al., "Soft X–Ray Production in Spark Discharges in Hydrogen, Nitrogen, Air, Argon and Xenon Gases," *Nuclear Instruments & Methods in Physics Research*, Section A, vol. 418, No. 2–3, Dec. 1998, pp. 405–419.

Melnychuk et al., "Plasma Focus Light Source with Improved Pulse Power System," Pub. No: US 2003/0006383 A1, published Jan. 9, 2003.

* cited by examiner

Primary Examiner—Nikita Wells
Assistant Examiner—Zia R. Hashmi
(74) Attorney, Agent, or Firm—Pillsbury Winthrop LLP

(57) ABSTRACT

A radiation source includes an anode and a cathode for creating a discharge in a vapor in a space between anode and cathode and to form a plasma of a working vapor so as to generate electromagnetic radiation. The cathode defines a hollow cavity in communication with the discharge region through an aperture that has a substantially annular configuration around a central axis of said radiation source so as to initiate said discharge. A driver vapor is supplied to the cathode cavity and the working vapor is supplied in a region around the central axis in between anode and cathode.

40 Claims, 4 Drawing Sheets

RADIATION SOURCE, LITHOGRAPHIC APPARATUS, DEVICE MANUFACTURING METHOD, AND DEVICE MANUFACTURED THEREBY

This is a continuation application of U.S. application Ser. No. 09/893,347, filed Jun. 28, 2001, now U.S. Pat. No. 6,667,484 which claims priority from European Patent Application No. 00202304.2, filed Jul. 3, 2000, the entire contents of which are hereby incorporated by reference.

BACKGROUND OF THE INVENTION

1. Field of the Invention

The present invention relates generally to lithographic projection apparatus and specifically to a plasma discharge radiation source for use therein.

2. Description of the Related Art

The term "patterning structure" as here employed should be broadly interpreted as referring to structure that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithographic apparatus the size of features that can be imaged onto the wafer is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet, also referred to as XUV or EUV, radiation. The abbreviation 'XUV' generally refers to the wavelength range from several tenths of nm to several tens of nanometers, combining the soft x-ray and Vacuum UV range, whereas the term 'EUV' is normally used in conjunction with lithography (EUVL) and refers to a radiation band from approximately 5 to 20 nm, i.e. part of the XUV range.

A radiation source for XUV radiation may be a discharge plasma radiation source, in which a plasma is generated by a discharge in a vapor between an anode and a cathode and in which a high temperature discharge plasma may be created by Ohmic (resistive) heating by a (pulsed) current flowing through the plasma. As used herein, "vapor" is intended broadly to include a gas, a suspension or a mixture. Further, compression of a plasma having some volume due to a magnetic field generated by a current flowing through the plasma may be used to create a high temperature, high density plasma on a discharge axis (dynamical pinch effect). Kinetic energy of the pinching plasma is directly transferred to the plasma temperature and hence to short-wavelength radiation. A dynamical pinch would allow for a discharge plasma having a considerably higher temperature and density on the discharge axis, offering an extremely large conversion efficiency of stored electrical energy into thermal plasma energy and thus into XUV radiation.

It has been proposed by R. Lebert, K. Bergmann, G. Schriever and W. Neff in a presentation entitled 'A gas discharge based radiation source for EUVL', Sematech Workshop Monterey (1999), to employ a hollow cathode for triggering plasma creation. A very effective way of self-initiation of a discharge may be obtained by a so-called transient hollow cathode discharge (THCD) in the hollow cathode. The radiation source as proposed by Lebert et al. is an axi-symmetric system with a specially configured cathode having a small aperture on-axis with a large cavity behind it forming a hollow cathode region. However, the hollow cathode generates the discharge breakdown and thus a plasma only on or in a small volume around the discharge axis, which does not allow making (full) use of the dynamical pinch effect referred to above. Further, the volume taken by a plasma around the discharge or central axis is generally badly controllable and its stagnation on the discharge axis after compression is therefore not sufficiently predictable to have an exactly timed pulse of generated XUV radiation.

Another drawback of a plasma discharge radiation source having the conventional central hollow cathode is that the plasma created may erode and change the form of the aperture of the hollow cathode, since it is present on the axis on which the high temperature plasma having a considerable density is created. The aperture will therefore be damaged by unavoidable axially oriented plasma jets, which limits the lifetime of the cathode and decreases the maintenance interval of the radiation source. Further, proper functioning of the hollow cathode for triggering the plasma is dependent on a predetermined relation between size of the aperture and depth of the cavity. Erosion of the aperture therefore undesirably influences the triggering instant of the plasma and the timing of the pulse of generated XUV radiation.

SUMMARY OF THE INVENTION

In one aspect of the present invention a radiation source is provided having an effective self-initiation that allows making use of the dynamical pinch effect to create a high-temperature, high-density plasma for an enhanced conversion efficiency of electrical energy into radiation.

Another aspect the invention provides a radiation source having a long maintenance interval.

Another aspect of the invention provides a radiation source having a well-defined timing of generated pulses, or shots, of XUV radiation.

According to one aspect of the present invention there is provided a radiation source comprising an anode and a cathode that are configured and arranged to create a discharge in a vapor in a space between said anode and cathode and to form a plasma of a working vapor so as to generate electromagnetic radiation. The cathode further defines a hollow cavity in communication with the discharge region through an aperture that has a substantially annular configuration around a central axis of said radiation source so as to initiate said discharge. The working vapor may include, for example, xenon, lithium vapor or tin vapor.

The present invention can provide that the discharge is being initiated by the annular hollow cathode at a predetermined distance from a central axis of the radiation source and take advantage of the dynamical pinch effect. The discharge is created at least at a distance from the central axis corresponding to the annular aperture so as to create an initial plasma. An electrical current flowing through the plasma between anode and cathode generates a magnetic field compressing the plasma from the distance (or radius) corresponding to the annular aperture towards the central axis so as to create a dense and hot plasma.

The discharge plasma created above the annular aperture may be chosen to have a low density such as not to cause erosion of the aperture. Both the density of the plasma and its distance to the annular aperture will increase upon compression towards the central axis. The distance of annular aperture may be chosen large enough not to cause erosion of the aperture at the final stagnation, or collapse, of the plasma on the central axis.

Further, the predetermined distance between annular hollow cathode provides a control radius where plasma compression starts, which results in a well-controllable timing of its collapse and generation of a pulse of XUV radiation.

In certain embodiments a driver vapor is supplied to said cavity. Further, the working vapor may be conveniently supplied in a region around said central axis of said space between said anode and cathode. In such embodiments control over the generation of pulses of XUV radiation is improved.

The hollow cathode provides for an effective self-organized discharge initiation having the practical feature that high repetition rates along with a high reproducibility may be achieved. The operation can basically be auto-triggered. To further increase the exact timing of the discharge and finally of the generation of a pulse of XUV radiation, one embodiment of the radiation source according to the invention includes a trigger electrode that is inserted in the cavity. When the radiation source is in a state that auto-triggering is almost going to take place, a voltage pulse applied to the trigger electrode will cause such a disturbance of the electrical field inside the cavity that the process will trigger. Any uncertainty in the timing of auto-triggering will in this way be eliminated by exactly timing a trigger pulse being applied to the trigger electrode. Appropriate electrical circuitry is employed to apply a voltage pulse to said trigger electrode.

To provide for a stable shot-to-shot electrically stored energy and a very fast supply of electrical energy to anode and cathode, the radiation source may include a capacitor connected to said anode and cathode, and may further include a charging circuit connected to said capacitor, said charging circuit including a further capacitor and a transformer for electrically coupling said capacitor and said further capacitor. Switches may control charging of said capacitor by said further capacitor, and of said further capacitor by a source of electrical power.

An electrical insulator will be provided to separate anode and cathode. To prevent degradation of the insulator by lithium vapor or tin vapor, a path between a region of said space between said anode and cathode where said vapor is provided and said electrical insulator is constructed and arranged to define a space for said vapor to condense along said path.

According to a further aspect of the present invention there is provided a lithographic projection apparatus including a radiation system for providing a projection beam of radiation, a support structure for supporting patterning structure, the patterning structure serving to pattern the projection beam according to a desired pattern, a substrate table for holding a substrate; and a projection system for projecting the patterned beam onto a target portion of the substrate, wherein said radiation system includes a radiation source as described above.

The present invention also provides a device manufacturing method including providing a substrate that is at least partially covered by a layer of radiation-sensitive material, providing a projection beam of radiation using a radiation system comprising a radiation source as described above, using patterning structure to endow the projection beam with a pattern in its cross-section, and projecting the patterned beam of radiation onto a target portion of the layer of radiation-sensitive material.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultraviolet radiation (XUV or EUV, e.g. having a wavelength in the range of 5 to 20 nm).

BRIEF DESCRIPTION OF THE DRAWINGS

The present invention and its attendant advantages will be described below with reference to exemplary embodiments and the accompanying schematic drawings, in which like parts are indicated by like references, and in which.

DETAILED DESCRIPTION OF EMBODIMENTS OF THE INVENITON

Embodiment 1

Figure 1:
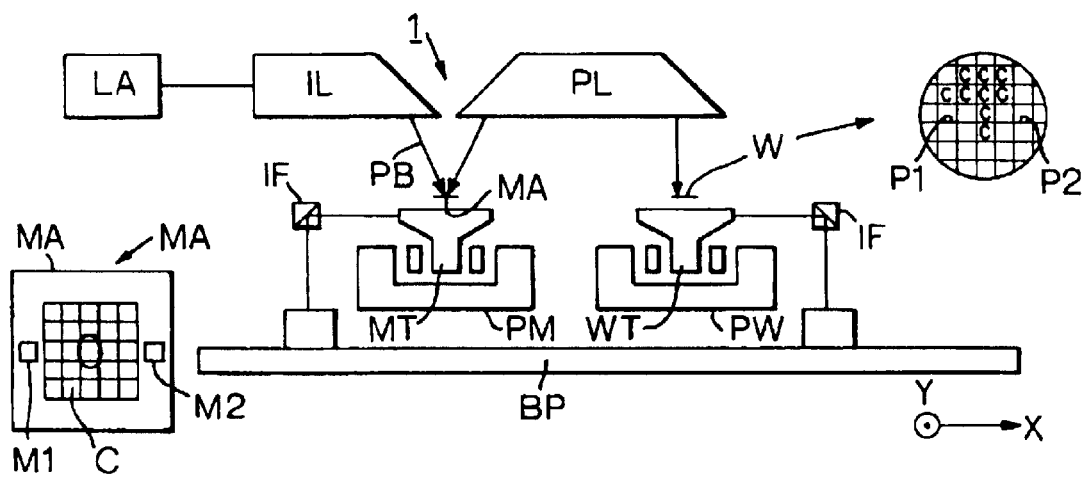
FIG. 1 depicts a lithographic projection apparatus comprising a radiation source according to the invention.

FIG. 1 schematically depicts a lithographic projection apparatus according to a particular embodiment of the invention. The apparatus includes a radiation system Ex, IL, for supplying a projection beam PB of XUV radiation. In this particular case, the radiation system also comprises a radiation source LA, a first object table (mask table) MT provided with a mask holder for holding a mask MA (e.g. a reticle), and connected to first positioning means for accurately positioning the mask with respect to item PL, a second object table (substrate table) WT provided with a substrate holder for holding a substrate W (e.g. a resist-coated silicon wafer), and connected to second positioning means for accurately positioning the substrate with respect to item PL, and a projection system ("lens") PL for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above. Since no materials are known to date that will transmit EUV (XUV) radiation, the lens will generally also consist of reflective elements. However, one skilled in the art will appreciate that should lens elements which transmit in the EUV spectrum be developed, such a transmissive lens system could be employed within the scope of the present invention.

The source LA produces a beam of radiation. This beam is fed into an illumination system (illuminator) IL, either directly or after having traversed conditioning means, such as a beam expander, for example. The illuminator IL may be adjustable for setting the outer and/or inner radial extent (commonly referred to as σ-outer and σ-inner, respectively) of the intensity distribution in the beam. Likewise, the illuminator IL may include the capability of producing a multipole profile, such as a quadrupole. In addition, it will generally comprise various other components, such as an integrator and a condenser. In this way, the beam PB impinging on the mask MA has a desired intensity distribution in its cross-section.

It should be noted with regard to FIG. 1 that the source LA may be within the housing of the lithographic projection apparatus, but that it may also be remote from the lithographic projection apparatus, the radiation beam which it produces being led into the apparatus (e.g. with the aid of suitable directing mirrors). The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the substrate table actuators (and interferometric measuring apparatus IF), the substrate table WT can be moved accurately, e.g. so as to position different target portions C in the path of the beam PB. Similarly, the mask table actuators can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

FIGS. 2a to 2e show a discharge plasma radiation source according to the invention. The source has cylindrical symmetry and comprises an anode 10 and a cathode 20 connected by an electrically insulating cylindrical wall 30. An aperture 11 is provided in anode 10 on central axis A for passing electromagnetic radiation from the source. Cathode 20 is provided with an annular aperture 21 around central axis A, and is further provided with a large cavity 22 behind aperture 21. Cavity 22 also has an annular configuration around central axis A, and the walls of the cavity are a part of cathode 20. Appropriate electrical circuitry (not shown in FIGS. 2a–e) is connected to anode 10 and cathode 20 to provide for a pulsed voltage V across the anode-cathode gap inside the radiation source. Further, a suitable working vapor, such as xenon or lithium vapor, at a certain pressure p is provided in between anode and cathode.

Figure 2A:
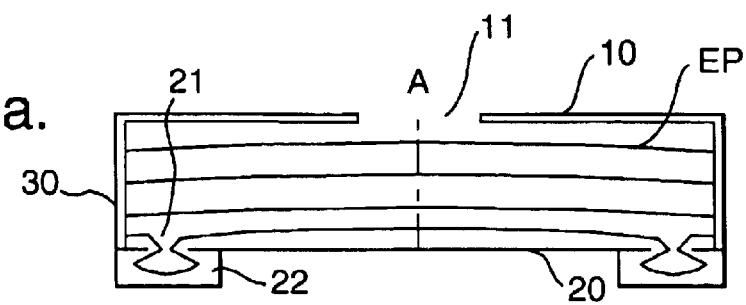
FIGS. 2a to 2e depict a radiation source according to a first embodiment of the invention and various stages of discharge initiation, plasma creation and plasma compression.

A discharge may take place at low initial pressure (p<0.5 Torr) and high voltage (V<10 kV) conditions, for which the electron mean free path is large compared to the dimension of the anode-cathode gap, so that Townsend ionization is ineffective. Those conditions are characterized by a large electrical field strength over vapor density ratio, E/N. This stage shows rather equally spaced equipotential lines EP having a fixed potential difference, as is depicted in FIG. 2a.

Figure 2B:
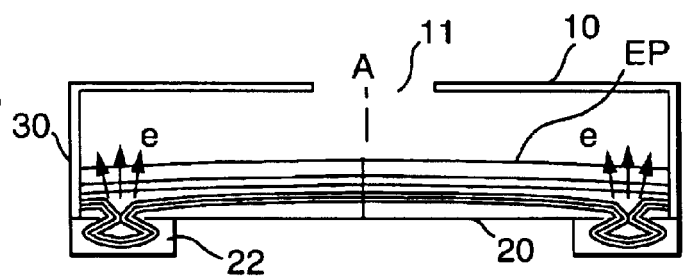

The ionization growth is initially dominated by events inside the hollow cathode that operates at considerable lower E/N, resulting in a smaller mean free path for the electrons. Electrons e from hollow cathode 20, and derived from a driver vapor within cavity 22, are injected into the anode-cathode gap, a virtual anode being created with ongoing ionization, which virtual anode propagates from anode 10 towards hollow cathode 20, bringing the full anode potential close to the cathode, as is shown in FIG. 2b by unevenly distributed equipotential lines EP. The electric field inside the hollow cavity 22 of cathode 20 is now significantly enhanced.

In the next phase, the ionization continues, leading to a rapid development of a high density plasma region inside the hollow cathode, immediately behind the cathode aperture 21. Finally, injection of an intense beam of electrons from this region into the anode-cathode gap, also shown in FIG. 2b, forms the final breakdown channel. The configuration provides for a uniform pre-ionization and breakdown in the discharge volume.

Figure 2C:
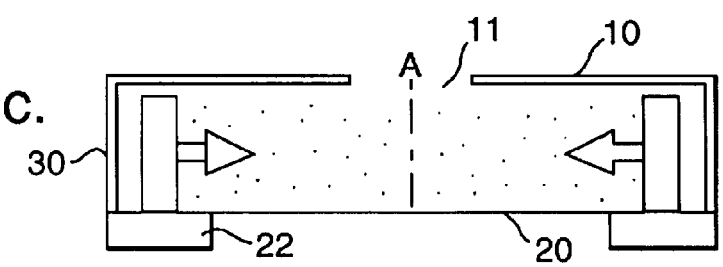

FIG. 2c shows that a discharge has been initiated and a plasma of the working vapor has been created in the anode-cathode gap. An electrical current will be flowing within the plasma from cathode 20 to anode 10, which current will induce an azimuthal magnetic field, having magnetic field strength H, within the radiation source. The azimuthal magnetic field causes the plasma to detach from the cylindrical wall 30 and to compress, as is schematically depicted in FIG. 2c.

Figure 2D:
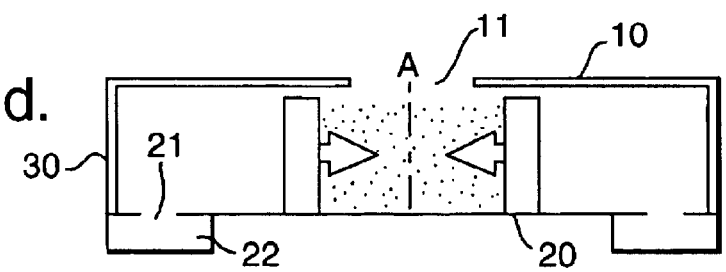
Figure 2E:
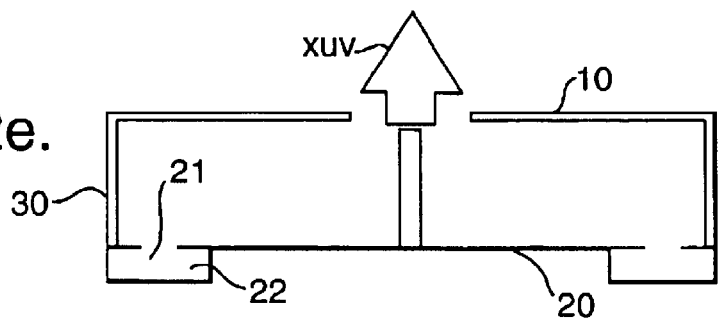

Dynamic compression of the plasma will take place, as further depicted in FIG. 2d, because the pressure of the azimuthal magnetic field is much larger than the thermal plasma pressure: $H^2/8\pi >> nkT$, in which n represents plasma particle density, k the Boltzmann constant and T the absolute temperature of the plasma. Electrical energy stored in a capacitor bank (not shown in FIG. 2) connected to anode 10 and cathode 20 will most efficiently be converted into energy of the kinetic implosion during the full time of the plasma compression. A homogeneously filled pinch with a high spatial stability is created.

At the final stage of plasma compression, i.e. plasma stagnation on central, or discharge, axis A, the kinetic energy of the plasma is fully converted into thermal energy of the plasma and finally into electromagnetic radiation having a very large contribution in the XUV and EUV ranges.

The radiation source according to the invention may be operated at a low initial pressure of the working gas in the anode-cathode gap to provide an easy interface of the source with a vacuum environment and to provide a better pre-ionization in the discharge volume. Further, a low initial pressure and the hollow cathode concept allow a direct electrical coupling of a capacitor bank with the anode-cathode gap. A low initial pressure is compensated by a reasonable radius of the annular hollow cathode to yield a dense resulting pinched plasma on discharge axis A. The resulting density is important since the total radiated power scales with the density squared. By choosing a larger distance between annular hollow cathode and discharge axis, a pinched plasma with a higher density is obtained.

The processes described with regard to FIGS. 2a to 2e also apply to the embodiments of the invention which are disclosed below.

Embodiment 2

Figure 3:
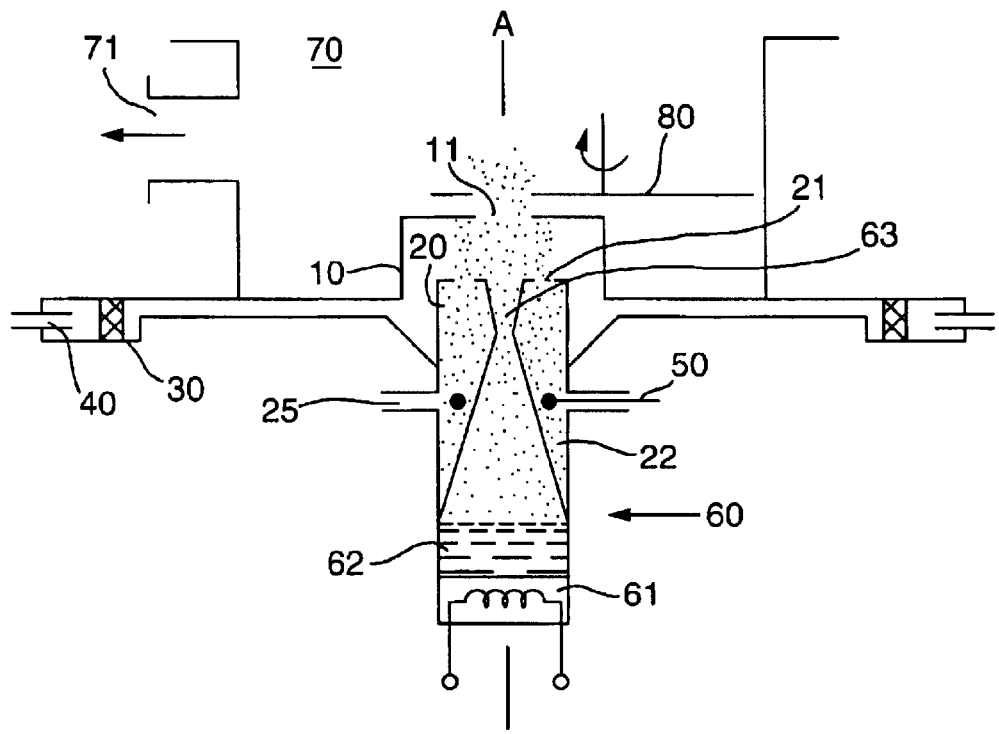
FIG. 3 depicts a radiation source according the a second embodiment of the invention.

FIG. 3 shows a second embodiment of a radiation source according to the invention. It shows the configuration of anode 10 and cathode 20, which are kept separated by an electrical insulator 30 and which are connected to a capacitor bank 40. A central part of the radiation source has cylindrical symmetry around central axis A. FIG. 3 further shows annular cathode aperture 21 and annular cathode cavity 22 around central axis A.

A driver vapor is supplied to cavity 22 via an inlet 25 so as to provide a low pressure within the cavity. In the present embodiment, argon (Ar) is taken as the driver gas, but basically any gas, such as for instance helium (He), neon (Ne) and hydrogen ($H_2$), is suitable. Hydrogen may be specially preferred since it shows a low absorption of radiation in the EUV range. The driver gas inside cavity 22 is used as a source of electrons to start a discharge between anode and cathode. In some applications a separate driver vapor may be dispensed with when any residual background pressure of working vapor, or any other vapor present, will prove to be sufficient inside cathode cavity 22.

The cathode cavity 22 surrounds a working vapor source 60, which ejects a working vapor in the anode-cathode gap in a region around central axis A. The working vapor is chosen for its spectral emission as a plasma. The present embodiment uses lithium (Li) for its very strong emission line at approximately 13.5 nm. Xenon (Xe) may also be used, which has a broad emission spectrum in the XUV (and EUV) region of the electromagnetic radiation spectrum. Another option is to employ tin (Sn) instead of lithium. The Li source 60 shown comprises a heater 61 below a container 62 containing solid lithium to be converted into a liquid and vapor by heater 61. Vaporized Li reaches the anode-cathode gap through a Laval nozzle 63.

A trigger electrode 50 is inserted in cathode cavity 22. Electrode 50 is connected to appropriate electrical circuitry (not shown in FIG. 3) for applying a voltage pulse to the electrode to start the discharge described with respect to FIGS. 2b and 2c. In the state shown in FIG. 2b, the radiation source is close to auto-triggering. A voltage pulse applied to trigger electrode 50 causes a disturbance of the electrical field within cathode cavity 22, which will cause triggering of the hollow cathode and the formation of a breakdown channel and subsequently a discharge between cathode 20 and anode 10. Trigger electrode 50 comprises a ring surrounding axis A within cathode cavity 22 and is connected to outside electronics.

Radiation emitted from a collapsed plasma will pass through an opening 11 in the anode 10 into a vacuum chamber 70 that is evacuated through opening 71 in a wall of the vacuum chamber. Plasma and debris particles may also escape through opening 11. A flywheel shutter 80 is present to block these particles when no XUV radiation pulse is emitted for preventing them to reach any optical elements in the radiation path of the XUV radiation to the projection system PL.

Embodiment 3

Figure 4:
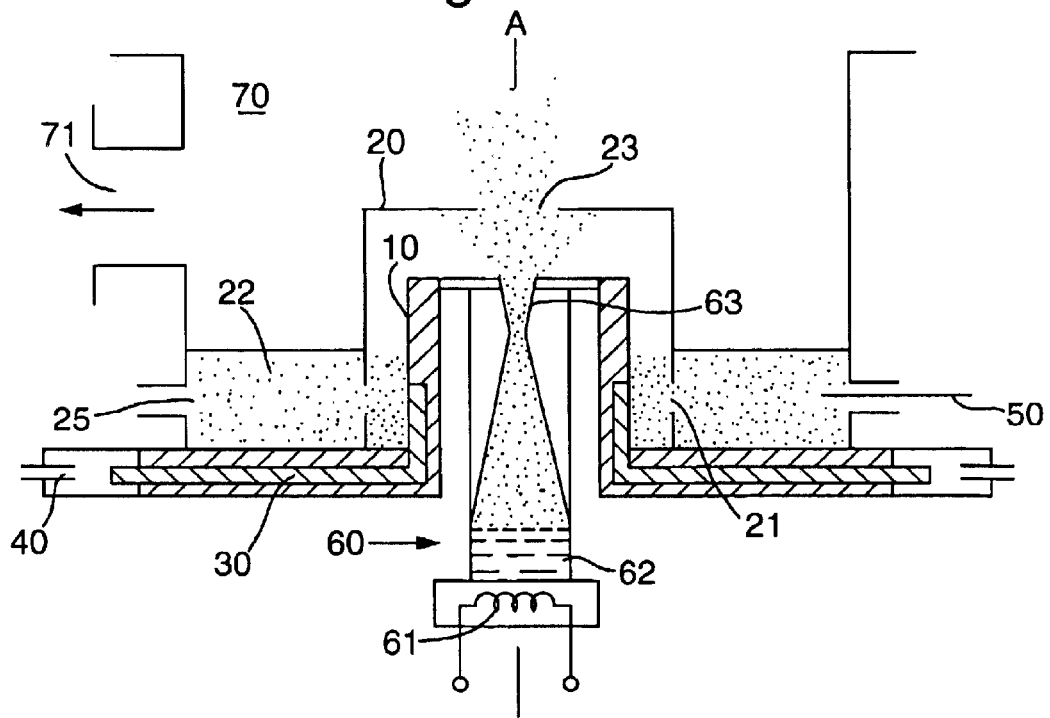
FIG. 4 depicts a radiation source according to a third embodiment of the invention.

FIG. 4 depicts a third embodiment of the invention, which is a variation to the second embodiment and further shields the aperture region of cathode 20 from plasma collapse at central axis A. Both anode 10 and cathode 20 have a "hat-like" structure. Annular cathode cavity 22 and aperture 21 are located at the bottom side of the hat. A plasma created by a discharge at aperture 21 will compress upwards and "around the corner" towards central axis A. Further, the positions of anode 10 and cathode 20 have been interchanged. Cathode 20 is located on the outside of the configuration and comprises aperture 23 for passing XUV radiation to vacuum chamber 70. Trigger electrode 50 in this embodiment takes the form of a needle electrode inserted in cathode cavity 22.

However, the density of the working vapor, also Li vapor in the present embodiment, may be too low at annular aperture 21 of cathode 20 for creating a discharge and a plasma. In embodiment 3, the radiation source is configured so as to yield a sufficiently high pressure of the driver vapor, Ar in the present embodiment, within the anode-cathode gap in the region at the annular aperture 21 for creating a discharge in the driver gas. The resulting plasma of the driver gas will start to compress towards central axis A and at some point encounter a sufficiently high pressure of the working vapor to create a plasma of the working vapor, which will then further compress until stagnation on central axis A. The plasma of the driver vapor may even first have to go "around the corner" to reach a sufficiently high pressure of the working vapor.

Embodiment 4

Figure 5:
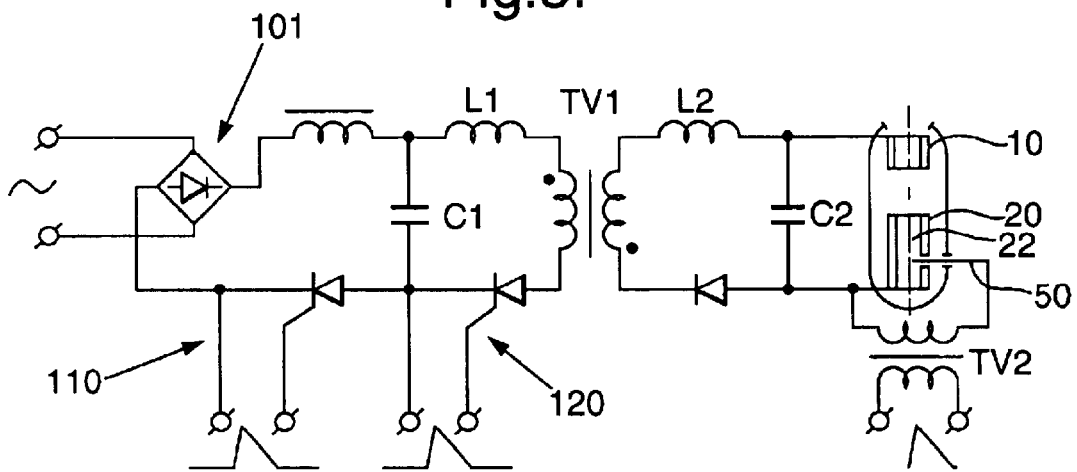
FIG. 5 depicts an electrical scheme for charging a capacitor bank and for supplying a trigger pulse to a trigger electrode of a radiation source according to a fourth embodiment of the invention.

FIG. 5 depicts an electrical circuit 100 of a radiation source according to a fourth embodiment of the invention and may be employed with the embodiments disclosed above. Electrical circuit 100 and a trigger electrode 50 may also be employed with a discharge plasma radiation source having a central hollow cathode, but are favorably employed with the annular hollow cathode concept.

In circuit 100 an AC voltage is rectified by rectifier 101 and applied to first capacitor bank C1 in a closed state of electronically controllable switch 110. Switch 110 may be put in a closed state by applying an appropriate pulse. First capacitor C1 is charged to a nominal voltage during a time interval that is (slightly) shorter than a time interval between subsequent XUV radiation pulses.

When first capacitor C1 is charged, a second electronically controllable switch 120 is closed to charge second capacitor bank C2 through a transformer TV1 within a few microseconds to a working voltage in the range of 3–5 kV with a stored energy in the range of 5–10 J. Second capacitor bank C2 is connected to anode and cathode of the radiation source. Second capacitor bank C2 corresponds to capacitor bank 40 shown in FIGS. 3 and 4.

Capacitor bank C2 will decharge when a discharge occurs between anode 10 and cathode 20. The discharge may be triggered as described with regard to the second embodiment using a trigger electrode 50 inserted in the cathode cavity 22. A voltage pulse may be supplied to trigger electrode 50 via a second transformer TV2.

Embodiment 5

Figure 6:
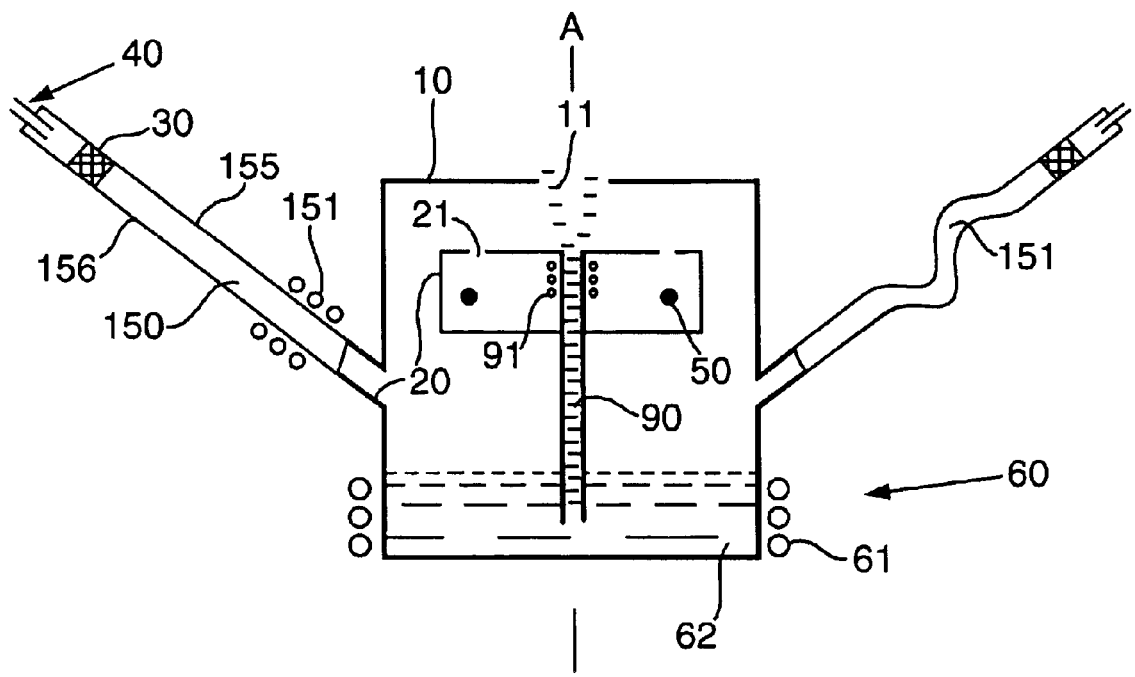
FIG. 6 depicts a radiation source according to yet another embodiment of the invention.

FIG. 6 schematically shows another embodiment of the invention, which incorporates a structure to pass lithium, or another appropriate material such as tin (Sn), to the anode-cathode gap by capillary action. Embodiment 5 corresponds to the previous embodiments save as described below. The structure may take the form of a tube 90 having an internal diameter of, for instance, 3 mm, one end of tube 90 being inserted in a bath 62 of lithium that is heated by heater 61 to such a temperature (in the order of 300° C. or above) so as to make the lithium liquid. The liquid lithium is drawn into the internal passage of the tube and transported to the other end by capillary action. At this end the lithium is heated by another heater 91 (to approximately 700° C.) to have the lithium leave the tube into the anode-cathode gap. The lithium will leave to tube according to some angular profile that generally is peaked along axis A. Depending on the dimensions of the exit opening of the tube, the lithium may leave the tube as a jet having an angular profile that is more sharply peaked than a thermal angular (cosine) distribution.

Figure 7:
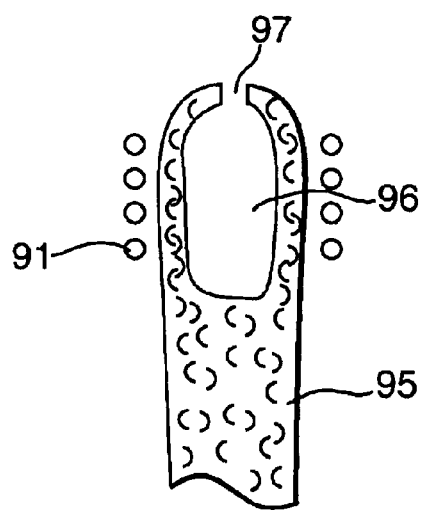
FIG. 7 depicts a detail of an alternative embodiment of a part of the radiation source of FIG. 6.

FIG. 7 shows a porous rod 95 that may replace tube 90 in FIG. 6 for transporting lithium by capillary action to the anode-cathode gap. A chamber 96 is provided at the end of rod 95 near the anode-cathode gap to collect the lithium transported through the porous rod out of lithium bath 62. An opening 97 is provided in the chamber for the lithium to escape to the anode-cathode gap. Depending on the dimensions of the opening, the temperature of the lithium in the chamber (heated by heater 91 to a temperature in the order of 700° C.) and the pressure of the lithium that builds up in the chamber, the lithium will leave opening 97 as a jet having some angular profile that may be sharply peaked along axis A.

FIG. 6 shows further that the electrical insulator 30 between anode and cathode is positioned at some distance from the region where the lithium is introduced in the anode-cathode gap. Lithium may chemically react with a ceramic isolator provided in between anode and cathode so as to erode it and/or make it electrically conductive, which both are to be avoided. To this end provisions are taken to prevent that lithium vapor in the anode-cathode gap will reach insulator 30. Measures are incorporated to condense lithium vapor before it may reach insulator 30 and the condensed lithium may be collected and transferred to lithium bath 62.

FIG. 6 shows that the distance between the hot region of the anode-cathode gap where the plasma is formed and insulator 30 provides a sufficiently long and narrow path 150 having such a temperature that at some point along that path a 'freezing point' for vaporized lithium is provided. The path is sufficiently long and narrow to provide cooling of lithium vapor upon collision with the wall of the path. Additionally, the path may have a curved stretch 151 to yield an increased number of collisions between that wall and the vapor as is shown in the right-hand side of FIG. 6. Further, cooling elements 152 may be provided along the path as shown in the left-hand side. Path 150 presents in the embodiment shown upper and lower walls 155, 156 that circumscribe axis A, upper wall 155 being electrically connected to anode 10 and lower wall 156 being electrically connected to cathode 20.

For the lithium to condense, the temperature at the freezing point along the path should be at approximately 300° C. or below. Having a temperature at approximately 300° C. will keep the lithium liquid so that it can be easily collected and returned to the lithium bath. From FIG. 6 it is obvious how this is achieved by having the liquid flow by gravity down the wall of the path towards lithium bath 62.

While specific embodiments of the invention have been described above, it will be appreciated that the invention may be practiced otherwise than as described. The description is not intended to limit the invention.

What is claimed is:

1. A radiation source comprising:
    a first electrode having an aperture substantially centered around a central axis of said radiation source for passing electromagnetic radiation from said radiation source; and
    a second electrode spaced apart from said first electrode to form a gap therebetween, said gap defining a discharge region, said gap being supplied with a working vapor,
    wherein one of said first electrode and said second electrode includes a hollow cavity in communication with said discharge region through an aperture that has a substantially annular configuration around the central axis of said radiation source, said hollow cavity is supplied with a driver gas.

2. A radiation source according to claim 1, wherein said first electrode is an anode and said second electrode is a cathode.

3. A radiation source according to claim 1, wherein said first electrode is a cathode and said second electrode is an anode.

4. A radiation source according to claim 1, wherein said cavity has a substantially annular configuration around the central axis of the radiation source.

5. A radiation source according to claim 1, wherein said first electrode and said second electrode are connected to different electrical potentials such that a plasma discharge is initiated in said driver gas inside said hollow cavity, followed by a compression of the plasma of the driver gas towards said central axis of said radiation source in which said plasma of the driver gas encounters the working vapor to create a plasma in the working vapor, the plasma in the working vapor emitting said electromagnetic radiation.

6. A radiation source according to claim 1, wherein said driver gas comprises at least one selected from the group comprising helium, neon, argon and hydrogen.

7. A radiation source according to claim 1, further comprising:
    a shutter disposed in the vicinity the aperture of the first electrode,
    wherein said shutter is adapted to substantially block particles formed in said discharge region.

8. A radiation source according to claim 7, wherein said shutter includes a flywheel.

9. A radiation source according to claim 7, wherein said shutter is adapted to open the aperture of the first electrode to let radiation pass through and to close the aperture of the first electrode to substantially block said particles.

10. A radiation source according to claim 1, wherein said working vapor is supplied in a region proximate said central axis of said gap between said first electrode and said second electrode.

11. A radiation source according to claim 10, wherein said working vapor is supplied along said central axis.

12. A radiation source according to claim 1, wherein said working vapor comprises xenon.

13. A radiation source according to claim 1, wherein said working vapor comprises at least one selected from the group comprising lithium vapor and tin vapor.

14. A radiation source according to claim 13, further comprising:
    a reservoir adapted to contain a material comprising at least one of lithium and tin;
    a heater arranged to heat at least a portion of said reservoir so as to create a vapor from said material; and
    a fluid passageway in communication with said reservoir to allow said vapor to enter said gap between said first electrode and said second electrode.

15. A radiation source according to claim 13, further comprising:
    a reservoir adapted to contain a material comprising at least one of lithium and tin;
    a first heater arranged to heat at least a portion of said reservoir so as to create a liquid from said material; and
    a fluid passageway in communication with said reservoir, said liquid created from said material is drawn inside said fluid passageway by capillary action.

16. A radiation source according to claim 15, further comprising:
a second heater in contact with a portion of said fluid passageway, wherein said second heater is arranged to heat at least a portion of said liquid drawn inside said fluid passageway so as to create a vapor from said liquid and to allow said vapor to enter said gap between said first electrode and said second electrode by capillary action.

17. A radiation source according to claim 15, wherein said fluid passageway includes a tubular section.

18. A radiation source according to claim 15, wherein said fluid passageway includes a porous rod.

19. A radiation source according to claim 18, wherein said porous rod is terminated at one of its ends with a chamber, said chamber being adapted to collect at least one of the lithium vapor and the tin vapor.

20. A radiation source according to claim 19, wherein said chamber includes an opening through which at least one of said lithium vapor and tin vapor escapes to said gap between said first electrode and said second electrode.

21. A radiation source according to claim 1, further comprising:
an electrical insulator disposed between said first electrode and said second electrode; and
a canal leading to a said gap between said first electrode and said second electrode,
wherein said electrical insulator is disposed inside said canal away from said working vapor.

22. A radiation source according to claim 21,
wherein said canal defines a path along which said working vapor condenses to form a liquid material.

23. A radiation source according to claim 22, wherein a temperature along said path is less than or equal to 300° C.

24. A radiation source according to claim 21, wherein said canal is inclined relative to a wall of a reservoir in said radiation source such that the liquid material is collected by gravity in said reservoir.

25. A radiation source according to claim 21, wherein said canal comprises a curved portion.

26. A radiation source according to claim 1, further comprising a trigger electrode, wherein at least a portion of said electrode is disposed within said hollow cavity.

27. A radiation source according to claim 26, further comprising an electrical circuit constructed and arranged to apply a voltage pulse to said trigger electrode.

28. A radiation source according to claim 27, wherein said electrical circuit comprises a transformer having primary and secondary windings, said primary windings being in electrical communication with a voltage source to supply said voltage pulse and said secondary windings being in electrical communication with one of said first electrode and second electrode and said trigger electrode.

29. A radiation source according to claim 1, wherein said radiation source is adapted to generate a beam of radiation having a wavelength between about 5 nm and about 20 nm.

30. A lithographic projection apparatus comprising:
a radiation system adapted to provide a projection beam of radiation;
a support structure adapted to support a patterning structure to pattern the projection beam according to a desired pattern;
a substrate table adapted to hold a substrate; and
a projection system disposed between said support structure and said substrate table, said projection system being configured to project the patterned beam onto a target portion of the substrate,
wherein said radiation system comprises:
a first electrode having an aperture centered around a central axis of said radiation source; and
a second electrode spaced apart from said first electrode to form a gap therebetween, said gap defining a discharge region, said gap being supplied with a working vapor,
wherein one of said first electrode and said second electrode includes a hollow cavity in communication with said discharge region through an aperture that has a substantially annular configuration around the central axis of said radiation source, said hollow cavity is supplied with a driver gas.

31. A radiation source comprising:
a plasma chamber adapted to house a plasma, said plasma chamber having an aperture through which a radiation emitted by said plasma passes;
a shutter disposed in a vicinity of said aperture,
wherein said shutter is adapted to substantially block particles formed in said plasma.

32. A radiation source according to claim 31,
wherein said shutter includes a flywheel.

33. A radiation source according to claim 31,
wherein said shutter is adapted to open the aperture to let said radiation emitted by said plasma to pass through and to close the aperture to substantially block said particles formed in said plasma.

34. A radiation source according to claim 31,
wherein a first wall of said chamber forms a first electrode and a second wall of said chamber forms a second electrode.

35. A radiation source comprising:
a source of material including at least one of lithium and tin;
an electrode disposed in the vicinity of said source,
wherein said electrode is configured to induce formation of a plasma in said at least one of the lithium and the tin, said plasma emitting a radiation having a wavelength in extreme ultraviolet range of wavelengths.

36. A radiation source according to claim 35, wherein said extreme range of wavelengths is between about 5 nm and about 20 nm.

37. A radiation source according to claim 35, further comprising:
a heater arranged to heat at least a portion of said source of material so as to create a vapor from said material; and
a fluid passageway in communication with said source of material to allow said vapor from said material to enter a region in said radiation source in which said plasma takes place.

38. A radiation source according to claim 37, wherein said fluid passageway includes a porous rod.

39. A radiation source according to claim 38, wherein said porous rod is terminated at one of its ends with a chamber, said chamber being adapted to collect a vapor from said material.

40. A radiation source according to claim 39, wherein said chamber includes an opening through which said vapor from said material escapes to said region in said radiation source in which said plasma takes place.

* * * * *